United States Patent [19]
Abe

[11] Patent Number: 5,823,794
[45] Date of Patent: Oct. 20, 1998

[54] IC PRESSING ROTATING LEVER MECHANISM IC SOCKET

[75] Inventor: Shunji Abe, Yokohama, Japan

[73] Assignee: Yamaichi Electronics Co., Ltd., Tokyo, Japan

[21] Appl. No.: 826,807

[22] Filed: Mar. 25, 1997

[30] Foreign Application Priority Data

Mar. 26, 1996 [JP] Japan .................................... 8-096006

[51] Int. Cl.$^6$ ...................................................... H01R 9/09
[52] U.S. Cl. ........................................................ 439/73
[58] Field of Search ............................. 439/73, 330, 331, 439/266, 267, 71, 72

[56] References Cited

U.S. PATENT DOCUMENTS

| | | | |
|---|---|---|---|
| 5,658,153 | 8/1997 | Ikeya et al. | 439/72 |
| 5,697,795 | 12/1997 | Abe | 439/266 |
| 5,752,846 | 5/1998 | Abe | 439/266 |

*Primary Examiner*—Neil Abrams
*Assistant Examiner*—Barry M. L. Standig
*Attorney, Agent, or Firm*—Wenderoth, Lind & Ponack, L.L.P.

[57] ABSTRACT

An IC pressing mechanism in an IC socket comprises a cover mounted in such a way to be able to move upwardly and downwardly with respect to a socket body, an IC pressing lever movable between a pressing position and a releasing position with respect to an IC package in accordance with upward and downward movement of the cover, such that, in the pressing position, the IC pressing lever urges an IC lead against a contact on a socket body, and a transmission lever for linking the cover and the IC pressing lever together. The transmission lever is connected at an upper end side thereof to the cover through a pin and rotatable inwardly and is outwardly about the pin. A lower end side of the transmission lever and an outer end side of the IC pressing lever are connected together through a pin. When the transmission lever are lowered in accordance with lowering of the cover, the pin connection portion between the lower end side of the transmission lever and the outer end side of the IC pressing lever is restricted in such a way to be caused to move downwardly and outwardly at the same time, and a pressing portion on an inner end of the IC pressing lever is caused to move upwardly and outwardly at the same time by the downward and outward movement of the pin connection portion.

13 Claims, 6 Drawing Sheets

5,823,794

IC PRESSING ROTATING LEVER MECHANISM IC SOCKET

BACKGROUND OF THE INVENTION

1. Field of the Invention

This invention relates to an IC pressing mechanism in an IC socket, in which an IC pressing lever is moved between a pressing position and a releasing position with respect to an IC in accordance with upward and downward movement of a cover which is mounted in such a way to be able to move, at the same time, upwardly and downwardly with respect to a socket body.

2. Brief Description of the Prior Art

Japanese Patent Laid-Open Publication No. Hei 3 (1991) -289077 discloses an IC pressing mechanism in an IC socket, in which a first rotating lever and a second rotating lever are linked together. The first rotating lever is disposed at a downward location of an IC and linked to a cover so that it is rotated in accordance with upward and downward movement of the cover. The second lever upstanding along a side surface of the IC is rotationally moved between an engaging position and a releasing position with respect to an upper surface of an IC body by rotational movement of the first rotating lever, and a downward force is exerted to the engaged portion by a spring so that an IC body is lowered to press an IC lead against a contact.

However, this prior art device has such shortcomings that since there are many pins such as the pin for linking a pair of rotating levers together and the pivot pins, timing establishment is difficult, and since errors at the pin portions are accumulated, it becomes difficult to transmit motion with a high degree of precision and as a result, insufficient engagement is liable to occur.

Moreover, since a distance between a press-down point located at a downward location of the IC and an engaging point with respect of an upper portion of the IC body is long, errors in amount of motion at each point are amplified and therefore, the problem of insufficient engagement is more seriously increased. Furthermore, since the first rotating lever is laid below the IC, an IC loading position becomes high and a length of the contact is increased to that extent. Therefore, electrical characteristics are degraded and pitches tend to be displaced.

The present invention has been accomplished in view of the above.

SUMMARY OF THE INVENTION

It is, therefore, a general object of the present invention to provide an IC pressing mechanism in an IC socket capable of obviating the above-mentioned problems inherent in the prior art.

In order to achieve the above object, there is essentially provided an IC pressing mechanism in an IC socket comprising a cover mounted in such a way to be able to move, upwardly and downwardly with respect to a socket body, an IC pressing lever movable between a pressing position and a releasing position with respect to an IC package in accordance with upward and downward movement of the cover such that, in the pressing position, the IC pressing lever urges an IC lead against a contact on a socket body, and a transmission lever for linking the cover and the IC pressing lever together. The transmission lever is connected at an upper end side thereof to the cover through a pin and is rotatable inwardly and outwardly about the pin. A lower end side of the transmission lever and an outer end side of the IC pressing lever are connected together through a pin. When the transmission lever is lowered in accordance with lowering of the cover, the pin connection portion between the lower end side of the transmission lever and the outer end side of the IC pressing lever is restricted in such a way to be caused to move downwardly and outwardly at the same time, and a pressing portion on an inner end of the IC pressing lever is caused to move upwardly and outwardly at the same time by the downward and outward movement of the pin connection portion.

The IC pressing mechanism in an IC socket according to the present invention may further comprise restriction means for establishing an amount of downward and outward movement of the lower end pin connection portion.

Additional objects and advantages of the present invention will be more readily apparent from the following detailed description of preferred embodiments thereof when taken together with the accompanying drawings.

DETAILED DESCRIPTION OF THE PREFERRED EMBODIMENTS

Figure 1:
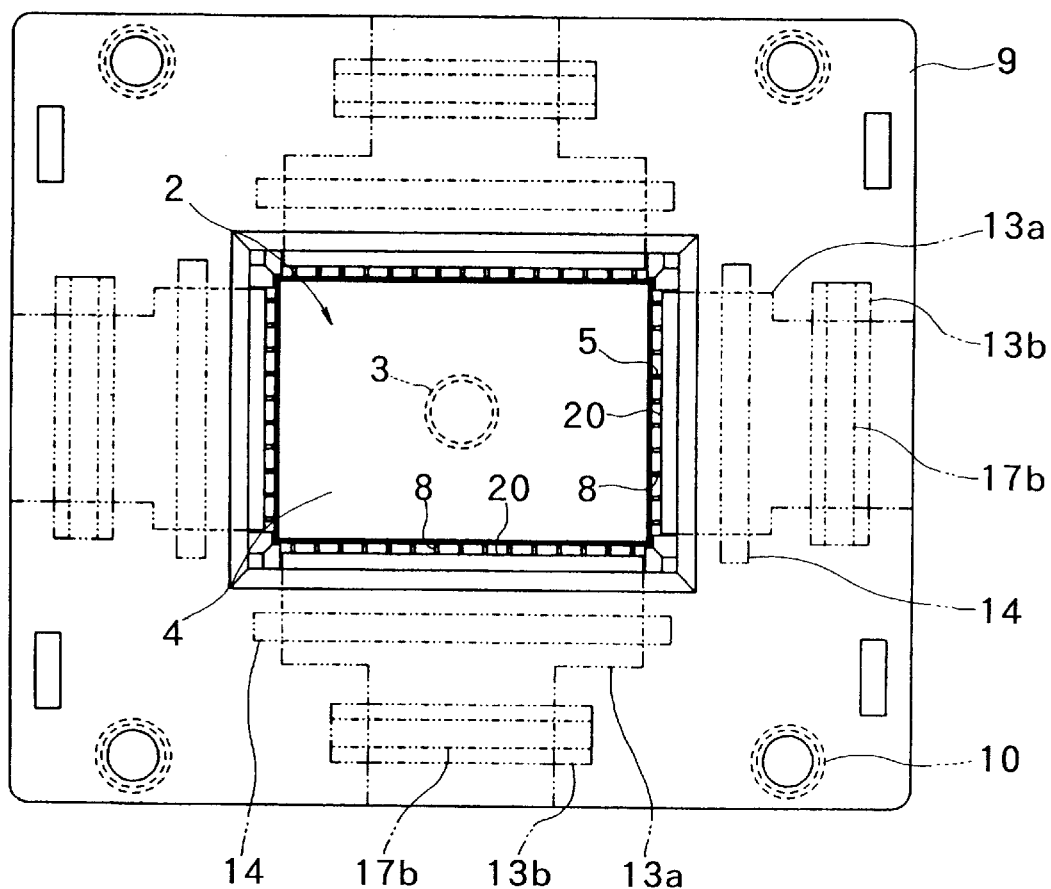
FIG. 1 is a plan view of an IC socket according to one embodiment of the present invention.
Figure 2:
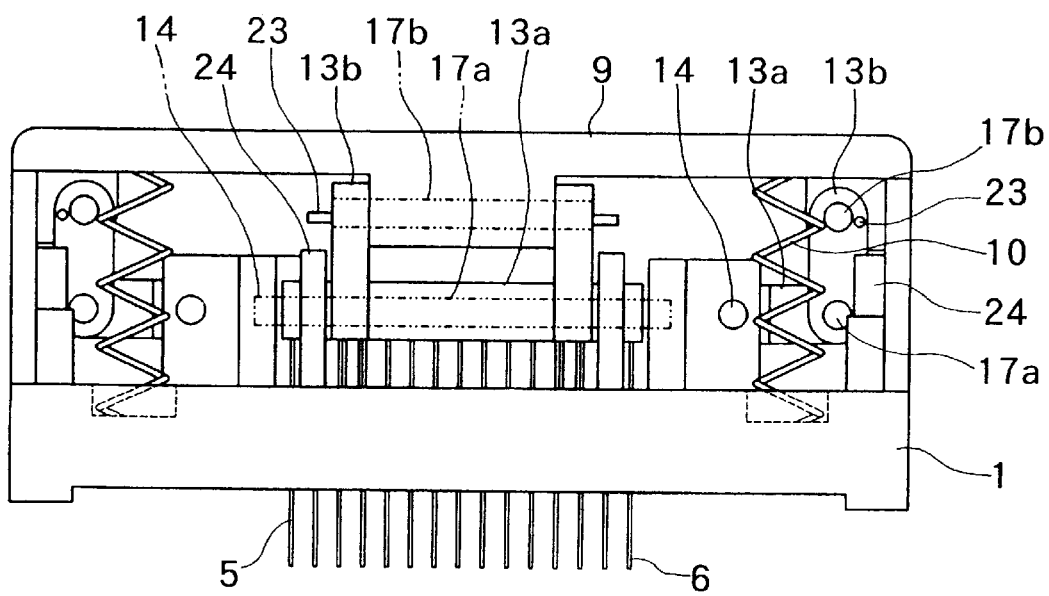
FIG. 2 is a side view of the socket.
Figure 3:
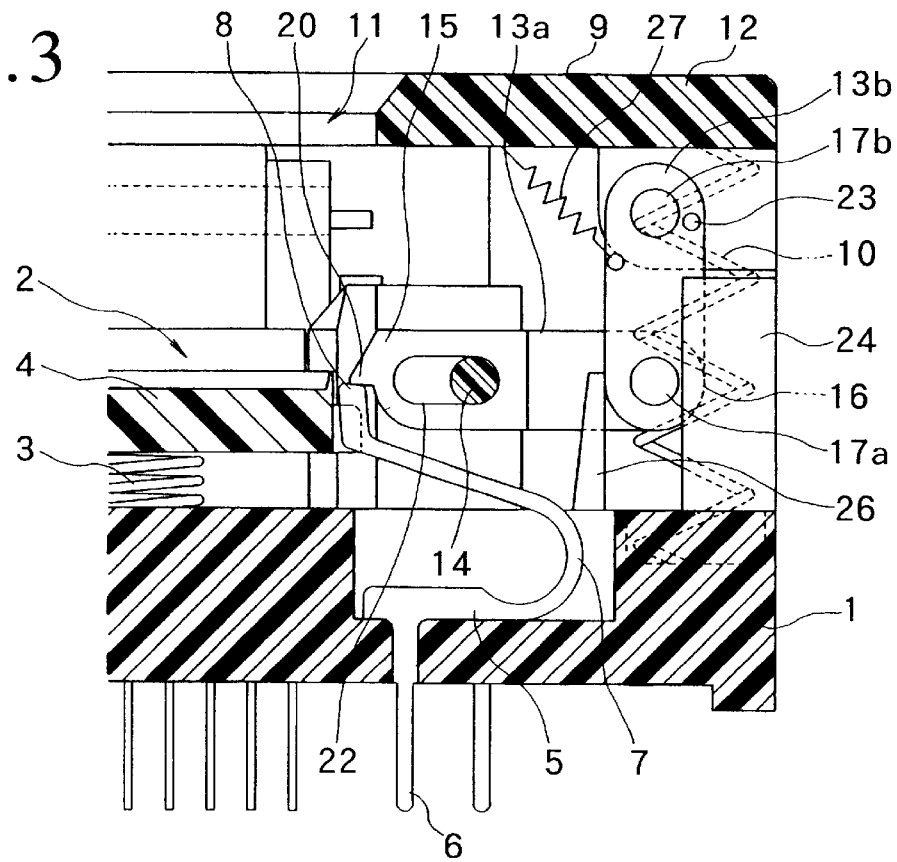
FIG. 3 is a half-cut sectional view of the socket showing a state of action of a pressing lever when a cover is lifted upwardly.

As shown in FIGS. 1 through 3, as well as elsewhere, a socket body 1 includes an IC receiving portion 2 opening at a central part of an upper surface thereof, a floating platform 4 resiliently supported on an inner bottom surface of the IC receiving portion 2 by a spring 3 for upward and downward movement, and a plurality of contacts 5 arranged along two or four opposing sides of the floating platform 4 (i.e., along two or four opposing sides of the IC receiving portion 2).

A lower end of each contact 5 is implanted in the socket body 1 to form an implanted portion. The lower end of each contact 5 further extends downwardly of the socket body 1 from the implanted portion to form a male terminal 6. The contact 5 further includes a spring portion 7 continuous with and extending upwardly from the implanted portion, a lead overlying and contacting portion 8 continuous with an upper end of the spring portion 7. The lead overlying and contacting portions 5 of the contacts 5 are, therefore, arranged along the two or four opposing sides of the floating platform 4.

On the other hand, a cover 9 overlying the socket body 1 is supported by springs 10 interposed between the cover 9 and the socket body 1 and disposed, for example, at each corner of the socket body 1. The cover 9 is pushed up under the effect of the springs 10 (FIG. 3).

The cover 9 includes an IC attaching-and-detaching window 11 defined by a frame wall and opening at an upper location of the IC receiving portion 2. This frame wall defining the window 11 forms a push-down manipulation portion 12.

An IC pressing lever 13a is laterally disposed immediately under the frame wall, i.e., push-down manipulation portion 12. As shown in FIGS. 2 through 7, as well as elsewhere, the pressing lever 13a is rotatably supported on the socket body 1 by a pivot pin 14 at a midway location of the laterally extending pressing lever 13a. The pressing lever 13a has an inner end 15 projecting inwardly from the pivotal portion, and an outer end 16 extending outwardly with a relatively long length from the pivotal portion. This outer end is linked to the cover 9 by a transmission lever 13b as later described.

The pressing lever 13a is formed at its inner end 15 with a lead pressing portion 20. This lead pressing portion 20 can be brought into engagement with and disengagement from an upper surface of an IC lead 19. When in engagement, the lead pressing portion 20 pushes down the IC lead 19 such that the IC lead 19 is pressed against the overlying-and-contacting portion 8 of the contact 5.

Although not shown, the inner end 15 of the pressing lever 13a can be brought into engagement with and disengagement from an edge portion of an upper surface of an IC body 18, so that when in engagement, the inner end 15 of the pressing lever 13a presses the lead 19 against the contact 5. At this time, the lead pressing portion 20 serves as a pressing portion of the IC body 18.

Figure 6:
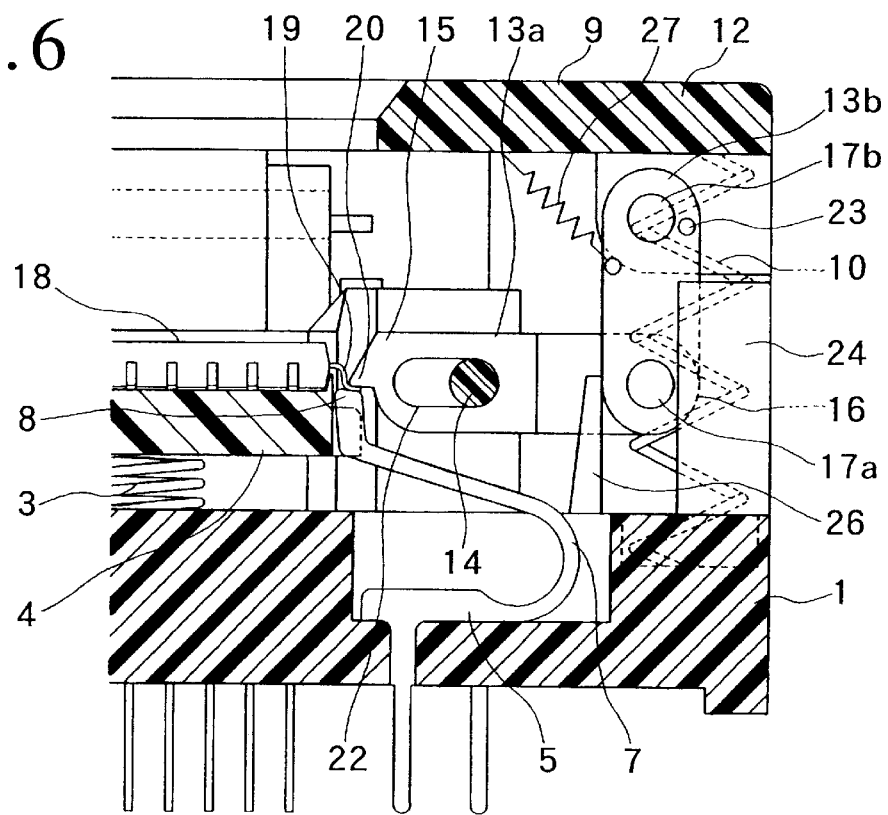
FIG. 6 is a sectional view showing a state of action of the pressing lever when an IC is loaded in the state of FIG. 5 and the cover is lifted upwardly.

An IC package includes a plurality of the leads 19 projecting sidewardly side from surfaces of the IC body 18. When the IC package is received in the IC receiving portion 2, a corresponding IC lead 19 is placed on or faced in proximal relation with the overlying-and-contacting portion 8 of the contact As shown in FIG. 6, when moving downwardly, the lead pressing portion 20 formed on the inner end 15 of the pressing lever 13a pushes down to the overlying-and-contacting portion 8 the upper surface of the IC lead 19 to thereby create a pressing state. On the other hand, as shown in FIG. 6, when moving upwardly, the pressing lever 13a is moved away obliquely upwardly and outwardly at the same time from the upper surface of the lead 19 to thereby create a released state. In this condition, the IC package can be loaded and unloaded.

Figure 8:
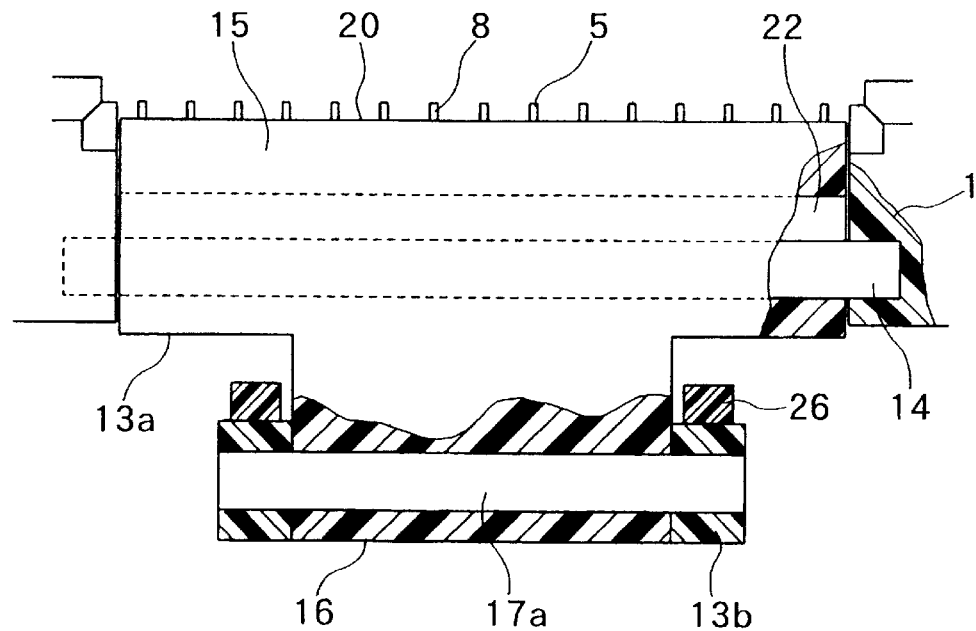
FIG. 8 is a plan view, partly cut away, showing an attached state of the pressing lever.

As shown in FIGS. 1, 3 and 8, as well as elsewhere, the pivot pin 14, about which the pressing lever 13a can rotate, is axially supported at its opposite ends by the socket body 1. The pivot pin 14 is loosely inserted into a guide hole 22 consisting of a laterally elongated hole formed in the pressing lever 13a.

The pressing lever 13a can move laterally inwardly and outwardly within an allowable range of the guide hole 22.

The pressing lever 13a is moved by a compound motion consisting of the above-mentioned lateral motion element and rotational motion element (upward and downward motion elements).

An upper end side of the transmission lever 13b is interconnected to the push-down manipulation portion 12 of the cover 9 by the upper end pin 17b, and a lower end side of the lever 13b extending downwardly from the connected portion of the upper end shaft can be rotated inwardly and outwardly about the pin 17b.

A lower end side of the transmission lever 13b is interconnected to the outer end side of the IC pressing lever 13a by a lower end pin 17a, and the required motions of the levers 13a, 13b occur in accordance with the upper and lower motion of the cover through the lower end pin connection portion.

That is, when the transmission lever 13b is lowered in accordance with the lowering motion of the cover 9, the pin connection portion 17a between the lower end side of the transmission lever 13b and the IC pressing lever 13a is restricted in such a way to move downwardly and outwardly at the same time. The lowering motion and outward movement of the pin connection portion cause the IC pressing portion on the inner end of the IC pressing lever 13a to move upwardly and outwardly at the same time.

As shown in FIG. 3, during the time the cover 9 is lifted upwardly by the push-up force of the spring 10, the push-up force of the spring 10 is applied to the pin connection portion 17a between the IC pressing portion 13a and the transmission lever 13b. This causes the outer end 16 of the pressing lever 13a to move upwardly and the inner end 15 and lead pressing portion 20 to move downwardly, so that the lead pressing portion 20 is pressed against the lead overlying and contacting portion 8 under the effect of the spring 10.

Referring back to the above-mentioned description, during the upward movement of the cover 9, the outer end 16 of the pressing lever 13a, i.e., the pin 17a of the pin connection portion is pulled up by the transmission lever 13b so as to move upwardly. During the downward rotational movement about the pin 14, the inner end 15 of the pressing lever 13a undergoes an inwardly moving component within an allowable range of the guide hole 22. Then, a combination of the above two motions causes the inner end 15 of the pressing lever 13a to move obliquely downwardly. At this time, the pin 14 is located on the outer end side of the guide hole 22.

Due to the above-mentioned combination of the rotational motion component (lowering motion component) with the inwardly moving component, the lead pressing portion 20 of the pressing lever 13 can positively be brought to the lead pressing position.

Figure 4:
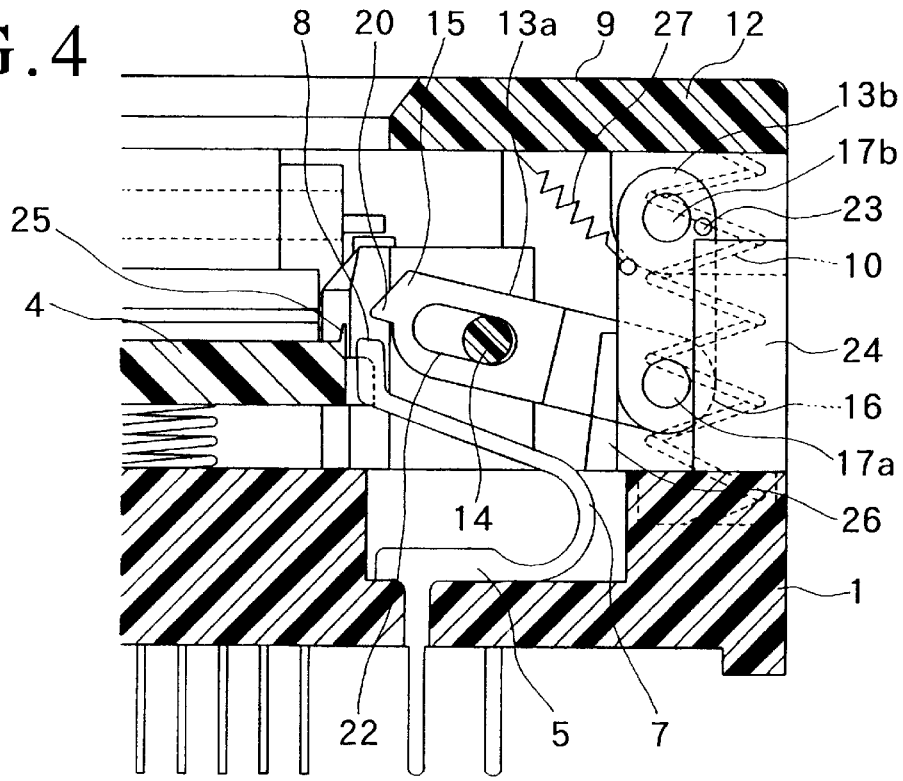
FIG. 4 is a sectional view showing a state of action of the pressing lever when the cover is pushed down to a midway position from the state of FIG. 3.
Figure 5:
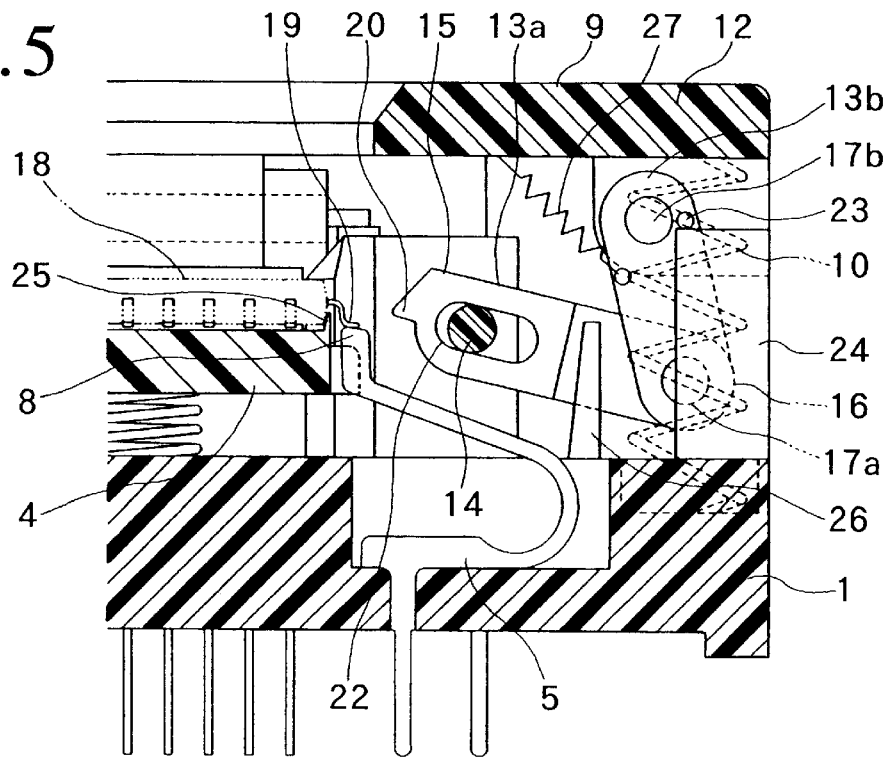
FIG. 5 is a sectional view showing a state of action of the pressing lever when the cover is pushed down to the lowermost position from the state of FIG. 4.
Figure 7:
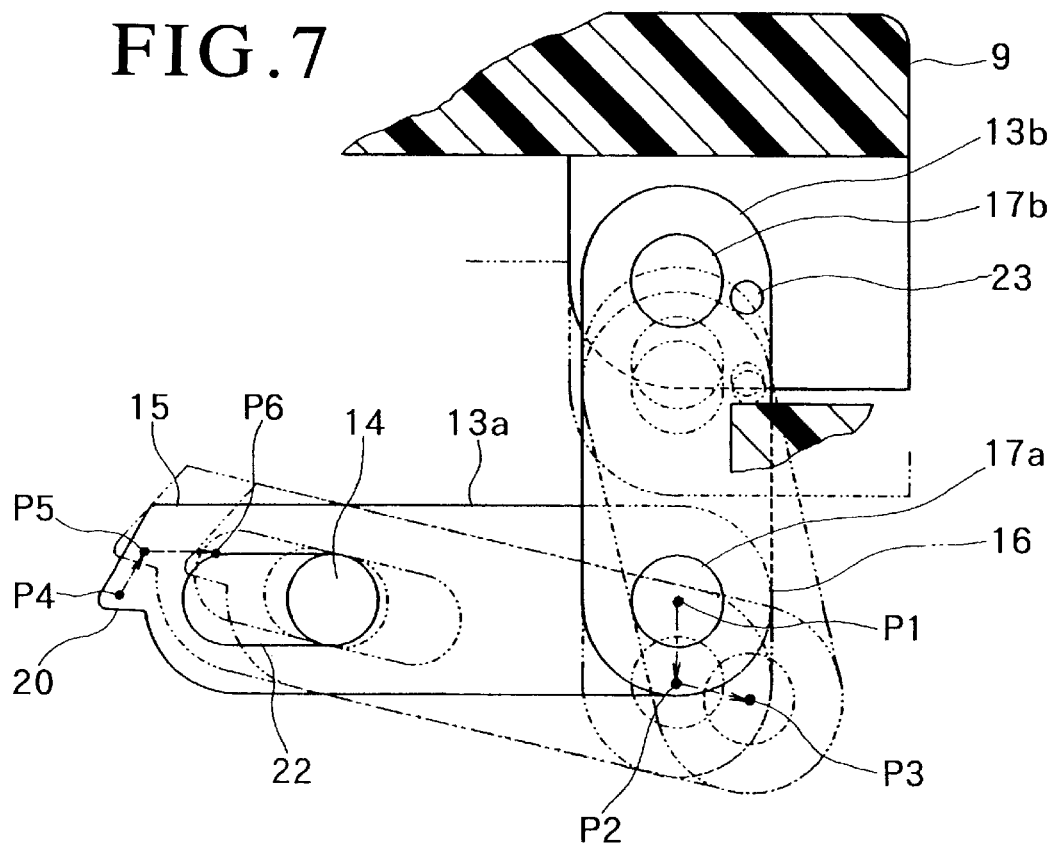
FIG. 7 is a side view showing action orbits of the cover, a transmission lever and the pressing lever.

Subsequently, when the cover 9 is pushed down vertically against the effect of the spring 10, the transmission lever 13b pin connected to the cover 9 is lowered as shown in FIGS. 4, 5 and 7, and the connection portion constituted by the pin 17a is generally vertically lowered during the initial lowering time of the transmission lever 13b, as shown in FIG. 4, so that the outer end 16 of the IC pressing lever 13a is generally vertically lowered about the pivot pin 14 and, at the same time, the lead pressing portion 20 on the inner end 15 is rotated upwardly so as to be brought away obliquely outwardly from the overlying and contacting portion 8.

When the cover 9 is further lowered, the connection portion formed by the lower end pin 17a is restricted by the lower motion component and the outer movement component so as to be lowered. As this restriction means, an abutment portion 23 such as a projection is formed on the upper end of the transmission lever 13b at a location offset from the axis of the upper end pin 17b. When lowering together with the transmission lever 13b, the abutment portion 23 is brought into abutment with a stopper 24. Due to this abutment, the transmission lever 13b is rotated outwardly about the upper end pin 17b against the effect of the spring 27, and at the same time, the connection portion formed by the lower end pin 17a is moved downwardly and outwardly at the same time. In order to guide the initial downward movement of the transmission lever 13b, the socket body 1 is provided with a guide wall 26. In operation, an inner surface of the transmission lever 13b is disposed along an outer surface of the guide wall 26 and a spring 27 is interposed in its stretched fashion between the transmission lever 13b and the cover 9. The lever 13b is biased inwardly by the spring 27 to press the transmission lever 13b resiliently against the guide wall 26, so that the initial lowering movement of the transmission lever 13b is ensured.

Owing to the operation so far described, the outer end 16 of the pressing lever 13a is lowered by the downwardly moving component and the outwardly moving component. In contrast, the inner end of the pressing lever 13a undergoes an outwardly moving component within the allowable range during its upward movement about the pin 14. A combination of the two motions causes the inner end 15 to rotate obliquely upwardly. At this time, the pin 14 is located on the inner end side of the guide hole 22.

As a consequence of a combination of the outwardly moving component sufficiently increased by the transmission lever 13b with the rotational motion component (upwardly moving component) as described, the lead pressing portion 20 of the pressing lever 13a is positively moved away from the lead 19.

After the released state is created as in FIG. 5, the IC package is received in the IC receiving portion 2 as in FIG. 6, and the side surface of the IC body 18 is restricted by a positioning wall 25 formed on a peripheral edge portion of the floating platform 4. At the same time, the lower surface of the IC lead 19 is overlaid and contacted to or placed in proximal relation to the upper surface of the overlying and contacting portion 8 of the contact 5.

Then, when the push down force exerted to the cover 9 is released, the cover 9 is, as shown in FIGS. 6 and 7, pushed up by the restoring force of the spring 10 and the upwardly moving force of the cover 9 is transmitted to the transmission lever 13b through the upper end pin 17a to thereby pull the lever 13b upwardly. As a consequence, the connection portion formed by the lower end pin 17a is moved, at the same time, inwardly and upwardly in accordance with the effect of the spring 27. Simultaneously, it causes the outer end 16 of the pressing lever 13a to be lifted upwardly and the overall pressing lever 13a is guided by the guide hole 22 so that the inner end 15 is rotated downwardly while being pushed inwardly.

Figure 9:
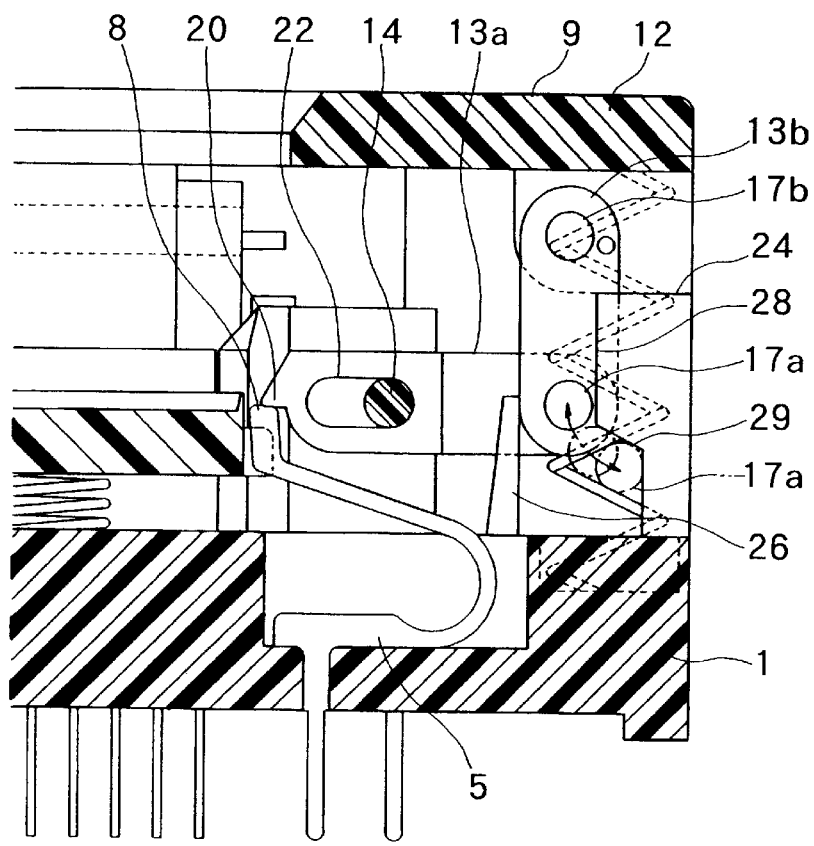
FIG. 9 is a half-cut sectional view of an IC socket showing another embodiment of the present invention.
Figure 10:
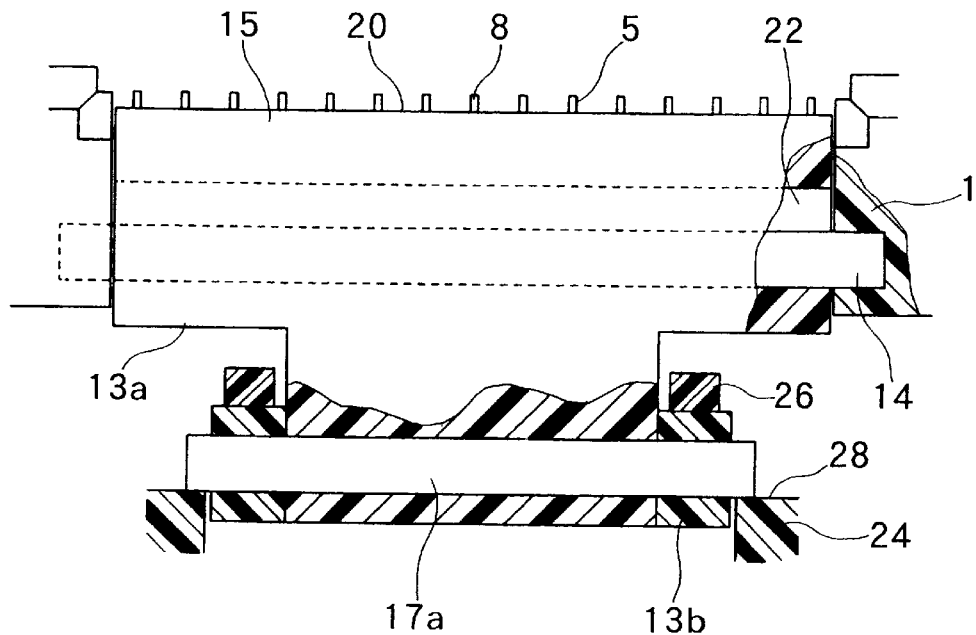
FIG. 10 is a plan view, partly cut away, showing a guide construction of a pin connection portion between a pressing lever and a transmission lever of FIG. 9.

FIG. 9 shows means for moving the connection portion formed by the lower end pin 17a inwardly and upwardly at the same time, without using the spring 27.

There is a provision of a lowering guide surface 28 continuous with the abutment surface which constitutes the stopper 24 and adapted to guide the lowering movement of the lower end pin 17a. There is a further provision of a slant guide surface 29 continuous with a lower end of the guide surface 28 and adapted to guide the lowering movement of the transmission lever 13b, between the lowering guide surface 28 and the lowering movement guiding wall 26. During the initial upward movement of the cover 9, the connection portion created by the lower end pin 17a is moved inwardly and upwardly, at the same time, along the slant guide surface 29.

As a consequence, as shown in FIG. 6, the lead pressing portion 20 is brought into engagement with the upper surface of the IC lead 19 through a compound motion consisting of the rotational motion (upward motion) and the lateral motion so as to exert a push-down force thereto. By this push-down force, the IC lead 19 is pushed against the lead overlying and contacting portion 8 of the contact 5.

As a consequence, the lead overlying and contacting portion 8 is flexed downwardly against the effect of the spring portion 7 and contacted, under pressure, with the lead 19 by its reaction. As previously mentioned, the present invention includes a case where the inner end of the pressing lever 13a is brought into engagement with the edge portion of the upper surface of the IC body 18.

When the cover 9 is lowered in the state of FIG. 6, the lead pressing portion 20 is moved upwardly and outwardly to thereby release the contacting state between the contact and the lead as previously described with reference to FIGS. 4 and 5.

As shown in FIG. 7, during the initial push-down motion of the cover 9, the outer end of the pressing lever 13, i.e., the connection portion created by the lower end pin 17a is vertically moved between a point $P_1$ and a point $P_2$, and then, during the final (or subsequent) push-down motion of the cover 9, the downwardly moving component is combined with the outwardly moving component and the connection portion is moved obliquely downwardly and outwardly between the point $P_2$ and a point $P_3$. On the other hand, the lead pressing portion 20 on the inner end 15 of the pressing lever 13a is rotated obliquely upwardly and outwardly between a point $P_4$ and a point $P_5$ during the initial push-down motion, and then, as shown in FIG. 7, to a point $P_6$ during the final push-down motion.

Figure 12:
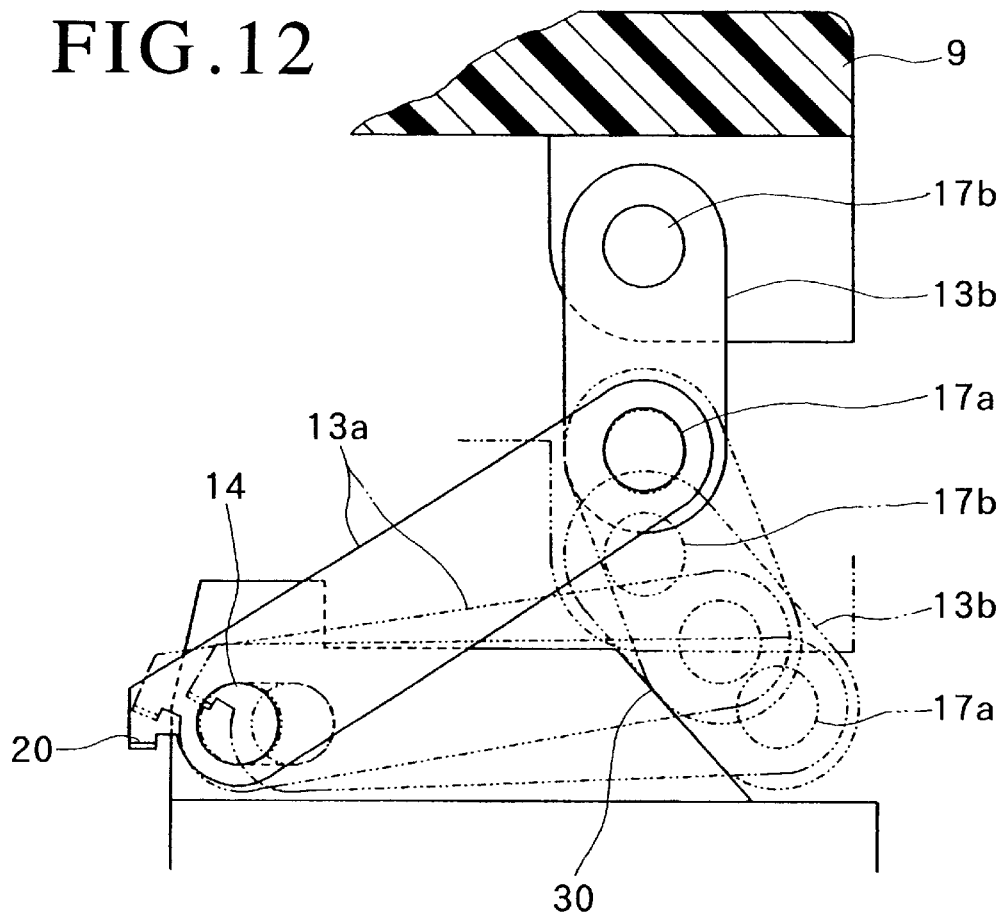
FIG. 12 is a side view showing another example of a pressing mechanism consisting of a cover and a transmission lever.

In FIG. 12, when the cover 9 is located in the uppermost position, the lower end pin 17a is located at position above the pivot pin 14 and the upper end pin 17b is located at position above of the lower end pin 17a.

For example, the IC pressing lever 13a is formed of such a slant lever which is upwardly slanted from the pin 14 towards the pin 17a, so that the pins 14 and 17a are correctly positioned relative to each other.

In FIG. 12, when the cover 9 is pushed down, the connection portion created by the lower end pin 17a is restricted so as to be immediately lowered by the downwardly moving component and the outwardly moving component. The pivot pin 14 is in abutment with the inner end of the guide hole 22. In this state, when a push-down force is applied to the lower end pin 17a by the cover 9, the pressing lever 13a and lower end pin 17a are immediately moved outwardly and the pressing lever 13a is rotated downwardly about the pivot pin 14. That is, the lower end pin 17a is moved obliquely downwardly and outwardly through the downwardly moving component and the outwardly moving component. In order to ensure the foregoing movement and increase the outwardly moving component, the lower end portion of the transmission lever 13b is forced to move backwardly by a slant cam surface 30.

Figure 11:
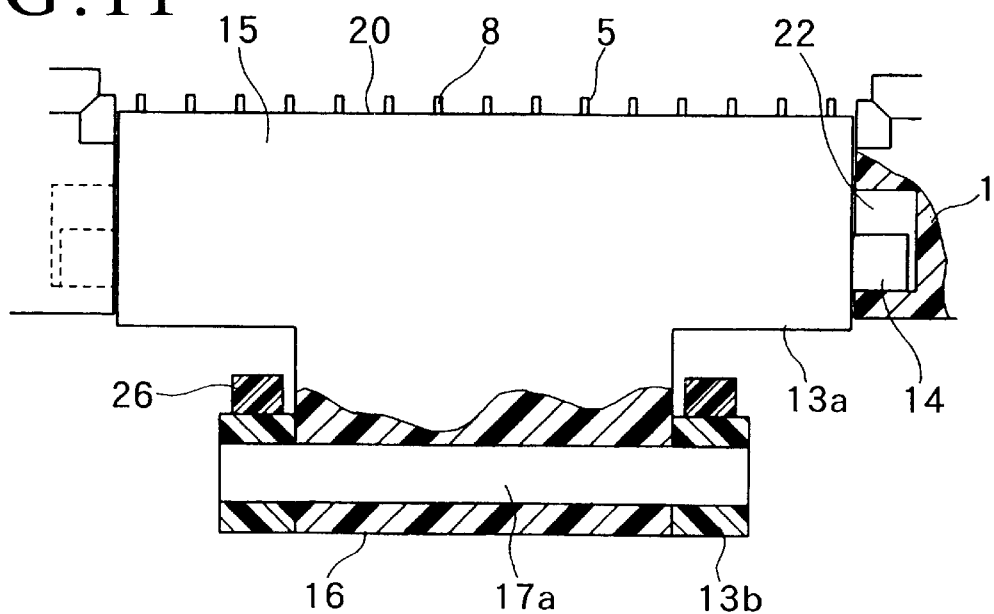
FIG. 11 is a plan view, partly cut away, showing another example of an attachment construction of the pressing lever.

As shown in FIG. 11, it is acceptable that the guide hole 22 is formed in a socket body 1 and the pivot pin 14 is formed on the pressing lever 13a.

As shown in FIGS. 1 and 8, the pressing lever 13a extends along each side edge portion of the IC receiving portion such that it corresponds to the contacts 5 arranged along each of the two or four sides of the IC receiving portion.

The pressing lever 13a is integrally molded from an insulative material, or an insulative material is disposed annexed to a pressing surface of the lead pressing portion.

The IC pressing mechanism in an IC socket according to the present invention has, when compared with the conventional devices, such technical effects that the link connection pin between the IC pressing lever and the transmission lever and the pivot pins of the various levers can be minimized in number, errors of the pin portions are reduced and the timing establishment can be made easily so that a transmission portion can be performed with a higher degree of precision and the IC pressing mechanism can positively be engaged with the very small IC lead. In addition, assembly of the IC pressing lever and transmission lever can be simplified.

Moreover, the stroke of the lever, i.e., the length of the connection portion between the IC pressing portion and the cover is shortened so that motion errors of the two levers can be reduced.

While there has been described what is at present considered to be the preferred embodiments of the invention, it will be understood that various modifications may be made thereto, and it is intended that the appended claims cover all such modifications as fall within the true spirit and scope of the invention.

What is claimed is:

1. An IC pressing mechanism in an IC socket comprising a cover mounted in such a way to be able to move upwardly and downwardly with respect to a socket body, an IC pressing lever movable between a pressing position and a releasing position with respect to an IC package in accordance with upward and downward movement of said cover, such that, when in said pressing position, said IC pressing lever is operable to urge an IC lead against a contact on a socket body, and a transmission lever for linking said cover and said IC pressing lever together, wherein said transmission lever is connected at an upper end side thereof to said cover through a pin and is rotatable inwardly and outwardly about said pin, wherein a lower end side of said transmission lever and an outer end side of said IC pressing lever are connected together through a pin connection portion, and when said transmission lever is lowered in accordance with lowering of said cover, said pin connection portion between the lower end side of said transmission lever and the outer end side of said IC pressing lever is restricted in such a way to move downwardly and outwardly, and a pressing portion on an inner end of said IC pressing lever is caused to move upwardly and outwardly by downward movement and outward movement of said pin connection portion.

2. An IC pressing mechanism in an IC socket according to claim 1, further comprising restriction means for establishing amounts of downward and outward movement of said pin connection portion.

3. An IC pressing mechanism in an IC socket according to claim 1, wherein when said transmission lever is lowered in accordance with an initial lowering motion of said lowering of said cover, said pin connection portion between said lower end side of said transmission lever and said outer end side of said IC pressing lever is moved substantially vertically downwardly and, at the same time, said pressing portion of said IC pressing lever is moved obliquely upward and outward; and when said transmission lever is lowered in accordance with a subsequent lowering motion of said lowering of said cover, said pin connection portion between said lower end side of said transmission lever and said outer end side of said IC pressing lever is moved outward and, at the same time, said pressing portion of said IC pressing lever is moved outward.

4. An IC pressing mechanism in an IC socket according to claim 3, wherein when said transmission lever is raised in accordance with an initial raising motion of a raising of said cover, said pin connection portion between said lower end side of said transmission lever and said outer end side of said IC pressing lever is moved inward and, at the same time, said pressing portion of said IC pressing lever is moved inward; and when said transmission lever is raised in accordance with a subsequent raising motion of said raising of said cover, said pin connection portion between said lower end side of said transmission lever and said outer end side of said IC pressing lever is moved substantially vertically upwardly and, at the same time, said pressing portion of said IC pressing lever is moved obliquely downward and inward.

5. An IC pressing mechanism in an IC socket according to claim 1, further comprising an abutment portion provided on said transmission lever at a location offset from an axis of said pin; and a stopper provided on said socket body, said abutment portion being abuttable against said stopper to force said transmission lever to rotate outwardly about said pin upon downward movement of said cover beyond a position at which said abutment portions abuts said stopper.

6. An IC pressing mechanism in an IC socket according to claim 5, further comprising a spring, interposed between said cover and said transmission lever, biasing said transmission lever inwardly about said pin.

7. An IC pressing mechanism in an IC socket according to claim 5, further comprising a slant guide surface provided on said socket body, said slant guide surface being slanted upwardly and inwardly so as to engage against said pin connection portion and guide said pin connection portion upwardly and inwardly as said cover is raised.

8. An IC pressing mechanism in an IC socket according to claim 1, further comprising a slant cam surface provided on said socket body, said slant cam surface being slanted downwardly and outwardly so as to engage said pin connection portion and guide said pin connection portion downwardly and outwardly as said cover is lowered.

9. An IC pressing mechanism comprising:

a socket body including an IC receiving portion and contacts respectively having contact portions;

a cover movably mounted to said socket body for downward movement toward said socket body and upward movement away from said socket body;

an IC pressing lever having an inner end and an outer end, said inner end of said IC pressing lever including an IC pressing portion and being pivotally and slidably mounted, by a pivot pin-and-slot connection, to said socket body;

a transmission lever having an upper end and a lower end, said upper end of said transmission lever being pivotally connected to said cover, and said lower end of said transmission lever being pivotally connected to said outer end of said IC pressing lever by a pin connection portion; and a restriction mechanism to force said pin connection portion to move outwardly upon downward movement of said cover beyond a predetermined position.

10. An IC pressing mechanism according to claim 9, wherein said restriction mechanism comprises:

an abutment portion provided on said transmission lever at a location offset from an axis of said pin; and a stopper provided on said socket body, said abutment portion being abuttable against said stopper to force said transmission lever to rotate outwardly about said pin upon downward movement of said cover beyond a position at which said abutment portion abuts said stopper.

11. An IC pressing mechanism according to claim 10, further comprising a spring, interposed between said cover and said transmission lever, biasing said transmission lever inwardly about said pin.

12. An IC pressing mechanism according to claim 11, further comprising a slant guide surface provided on said socket body, said slant guide surface being slanted upwardly and inwardly so as to engage against said pin connection portion and guide said pin connection portion upwardly and inwardly as said cover is raised.

13. An IC pressing mechanism according to claim 9, wherein said restriction mechanism comprises:

a slant cam surface provided on said socket body, said slant cam surface being slanted downwardly and outwardly so as to engage said pin connection portion and guide said pin connection portion downwardly and outwardly as said cover is lowered.

* * * * *